United States Patent
Qiu et al.

(10) Patent No.: US 8,537,566 B2
(45) Date of Patent: Sep. 17, 2013

(54) DISPLAY UNIT HAVING ANTI-EMI CAPABILITY

(75) Inventors: Ji-Feng Qiu, Shenzhen (CN); Ke-Hui Peng, Shenzhen (CN); Li-Ni Liang, Shenzhen (CN); Ren-Wen Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 369 days.

(21) Appl. No.: 13/076,468

(22) Filed: Mar. 31, 2011

(65) Prior Publication Data

US 2012/0230002 A1   Sep. 13, 2012

(51) Int. Cl.
*H05K 7/02*   (2006.01)

(52) U.S. Cl.
USPC ............................................ 361/809; 361/799

(58) Field of Classification Search
USPC ............... 361/799, 816, 818, 807, 809, 810
See application file for complete search history.

(56) References Cited

U.S. PATENT DOCUMENTS

| 6,067,133 | A* | 5/2000 | Niibori et al. | 349/60 |
| 6,288,489 | B1* | 9/2001 | Isohata et al. | 313/582 |
| 7,961,458 | B2* | 6/2011 | Yukawa et al. | 361/679.21 |
| 2003/0090458 | A1* | 5/2003 | Tajima | 345/156 |
| 2004/0141101 | A1* | 7/2004 | Osu et al. | 349/58 |

* cited by examiner

*Primary Examiner* — Hung S Bui
(74) *Attorney, Agent, or Firm* — Altis Law Group, Inc.

(57) ABSTRACT

A display unit includes a lower cover, a display disposed on the lower cover, a metal bracket securing the display on the lower cover and an upper cover fixed to the lower cover to sandwich the display and the bracket between the lower cover and the upper cover. The bracket includes a plate pressing a back side of the display towards the lower cover and a tab contacting a lateral face of the display. The bracket is grounded.

15 Claims, 3 Drawing Sheets

DISPLAY UNIT HAVING ANTI-EMI CAPABILITY

BACKGROUND

1. Technical Field

The present disclosure relates to a display unit, and more particularly, to a display unit having a good anti-EMI capability.

2. Description of Related Art

Display systems perform important roles in people's daily lives for showing images. A display system often includes a display, and an enclosure accommodating the display. The display is driven by a driving module to show required images. Generally, in order to prevent EMI (electromagnetic interference) from negatively affecting normal operation of the display, the driving module is grounded to remove static electricity generated on the display to the ground. However, accompanying the much higher driving frequencies of the driving module nowadays, the static electricity discharging capability of the driving module becomes insufficient, and the driving module alone is thus incompetent for handling such static electricity discharging function. Other attempts are required for resolving such a problem.

What is needed, therefore, is a display unit which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
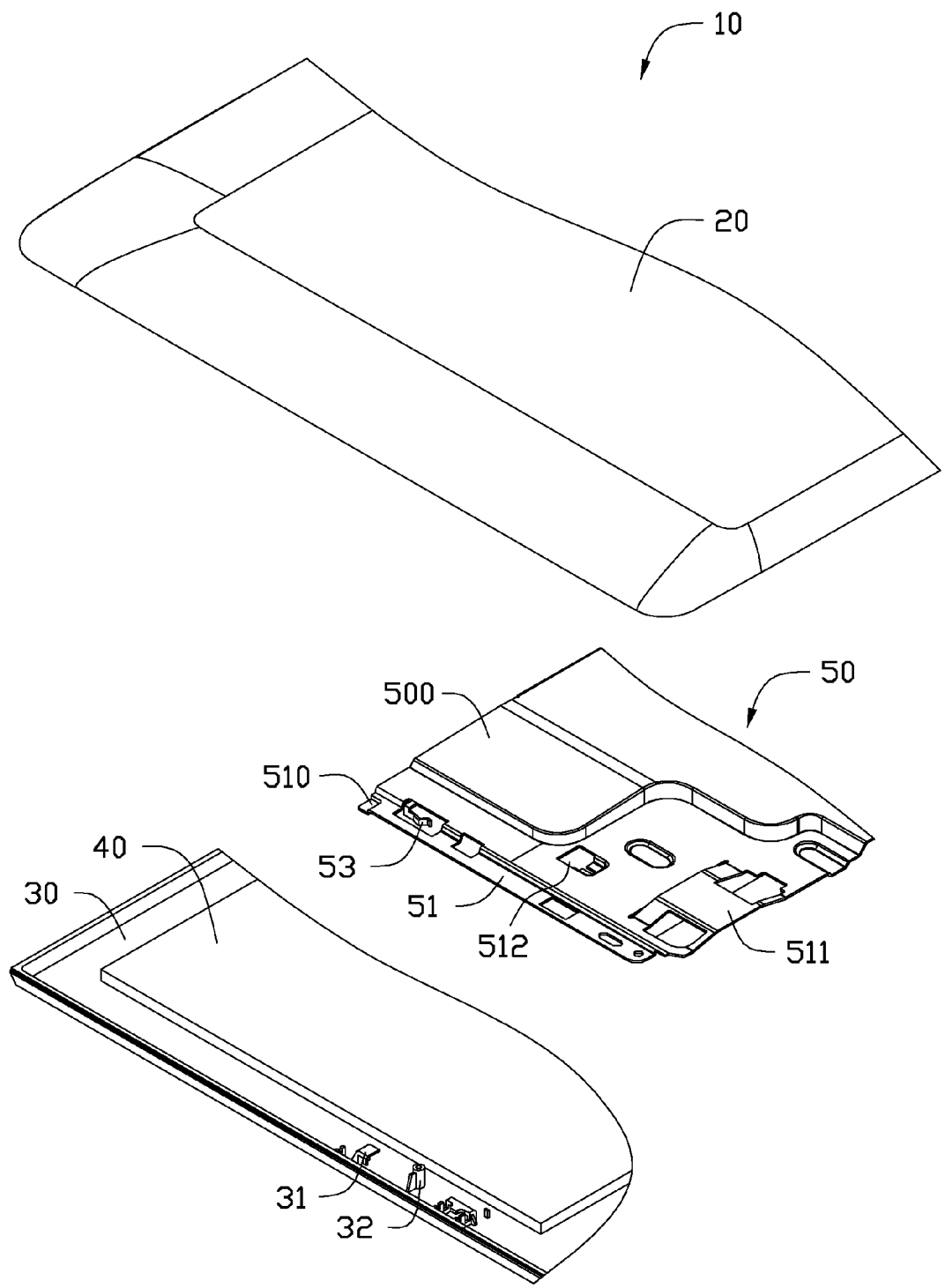
FIG. 1 shows a partially exploded display unit in accordance with an embodiment of the present disclosure.
Figure 2:
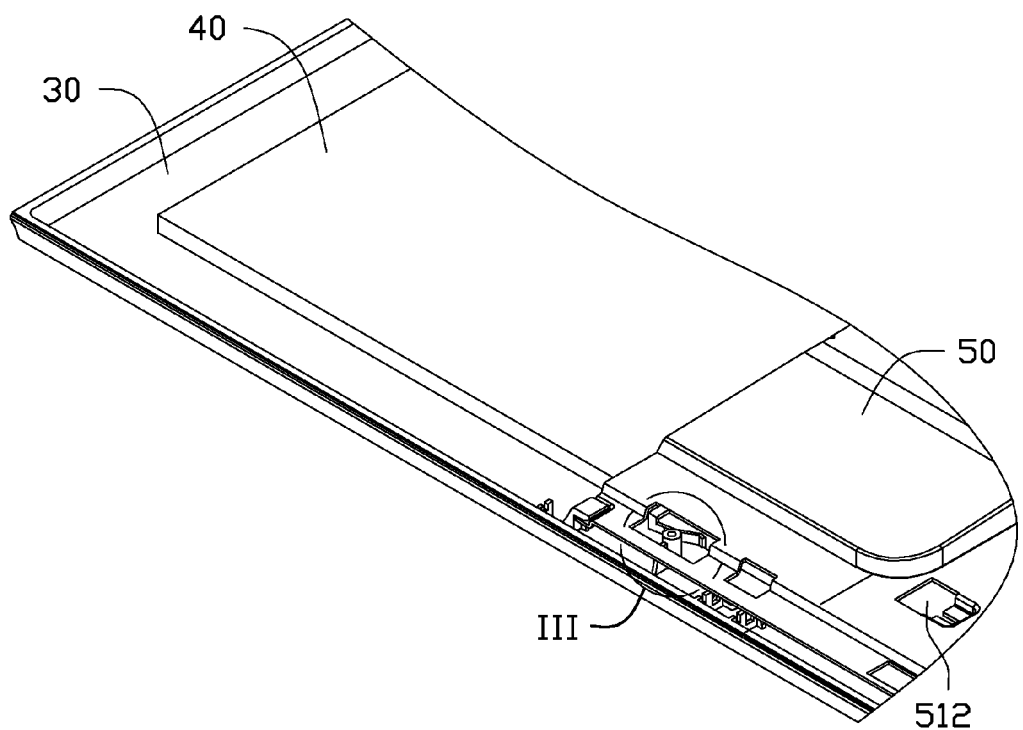
FIG. 2 is an assembled view of the display unit of FIG. 1, wherein an upper cover of the display unit is removed for clarity.

Referring to FIGS. 1-2, a display unit 10 in accordance with an embodiment of the present disclosure is disclosed. The display unit 10 includes a lower cover 30, an upper cover 20, a display 40 and a bracket 50 sandwiched between the lower cover 30 and the upper cover 20.

Figure 3:
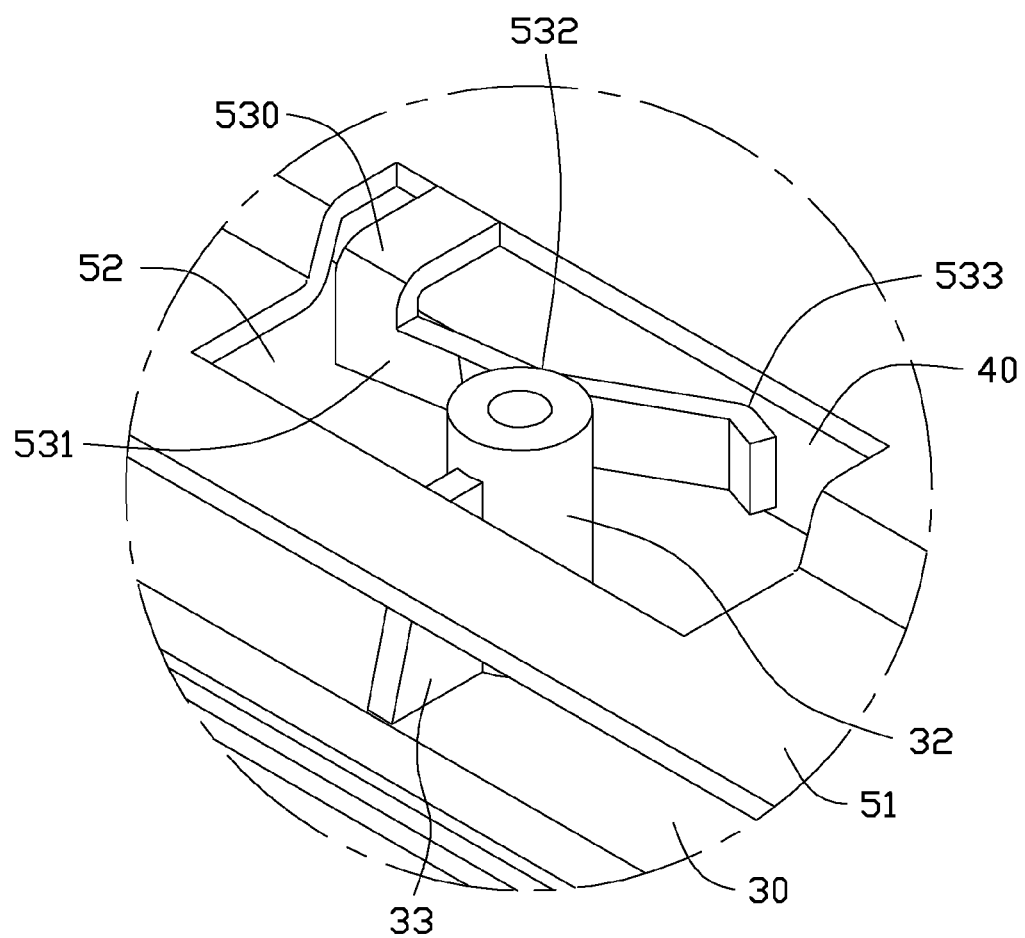
FIG. 3 shows an enlarged part III of FIG. 2.

The lower cover 30 is made of rigid plastic or other electrically-insulating materials. The lower cover 30 has a relatively large window (not shown) defined in a central area thereof. The lower cover 30 has a hook 31 extending upward near an edge thereof. The hook 31 has a lower portion perpendicular to an inner face of the lower cover 30 and an upper portion extending horizontally from the lower portion. Referring also to FIG. 3, a post 32 is protruded upwardly from the inner face of the lower cover 30. The post 32 is hollow and has a circular cross section. The post 32 has a reinforcing fin 33 connecting an outer circumferential surface thereof with the inner face of the lower cover 30 for increasing the strength of the post 32. The hook 31 is located adjacent to the post 32 and the upper portion of the hook 31 is oriented towards the post 32.

The display 40 is received within the lower cover 30. The display 40 may be a liquid crystal display, an organic light emitting diode display or other suitable displays. The display 40 is disposed on the inner face of the lower cover 30 and exposed within the window of the lower cover 30. The display 40 is located neighboring the hook 31 and the post 32.

The bracket 50 is made by punching a single piece of metal sheet. The bracket 50 is grounded via a wire (not shown). The bracket 50 includes a plate 500 and a flange 51 bent downwardly and then horizontally from a side of the plate 500. The plate 500 presses a back side of the display 40 against the lower cover 30 to secure the display 40 to the lower cover 30. The plate 500 has a plurality of protrusions 511 and holes 512 to lock with corresponding structures (not shown) of the upper cover 20. The flange 51 forms a depression 510 at a corner thereof corresponding to the hook 31 of the lower cover 30. The upper portion of the hook 31 can press against the depression 510 to lock the lower cover 30 with the bracket 50. An opening 52 is defined at a boundary of the plate 500 and the flange 51. The bracket 50 has a tab 53 extending from the plate 500 within the opening 52. The tab 53 includes a supporting section 530 extending horizontally from the plate 500 and a pressing section 531 extending downwardly and vertically towards the lateral side of the display 40. The supporting section 530 is parallel to the plate 500 and located higher than the pressing section 531. The pressing section 531 is perpendicular to the supporting section 530 and the plate 500, and is extended parallel to the side of the plate 500. The pressing section 531 has two contacting positions 532, 533 along a length thereof, wherein the pressing section 531 is bent inwardly at one contacting position 532 towards the display 40 and bent outwardly at the other contacting position 533 away from the display 40 along a direction from the supporting section 530 towards a free end of the tab 53. The post 32 contacts the contacting position 532 of the pressing section 531 of the tab 53 by the outer circumferential surface thereof to push the tab 53 to deform inwardly towards the display 40. The other contacting position 533 of the tab 53 contacts a lateral side of the display 40 under the abutting force from the post 32. Therefore, the static electricity generated on the lateral side of the display 40 can be discharged or dissipated to the ground by using the bracket 50 through the tab 53, and the electromagnetic disturbance affecting the display 40 can be well-prevented.

The upper cover 20 is secured to the lower cover 30 to sandwich the display 40 and the bracket 50 therebetween. The upper cover 20 has a size similar to that of the lower cover 30. The upper cover 20 may be made from a material equal to that of the lower cover 30. The lower cover 30 and the upper cover 20 cooperatively protect the display 40 from outside environment.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A display unit comprising:

a lower cover;

a display disposed on the lower cover;

a bracket securing the display on the lower cover, the bracket is made of metal; and an upper cover fixed to the lower cover to receive the display and the bracket between the upper cover and the lower cover;

wherein the bracket comprises a plate pressing against a back side of the display towards the lower cover and a tab extending from the plate and in contact with a lateral side of the display, and the bracket is grounded; and wherein the tab comprises a supporting section extending from the plate and a pressing section extending downwardly and towards the lateral side of the display.

2. The display unit as claimed in claim 1, wherein the supporting section is parallel to the plate.

3. The display unit as claimed in claim 2, wherein the pressing section is perpendicular to the supporting section.

4. The display unit as claimed in claim 1, wherein the pressing section comprises a first contacting position in contact with the lateral side of the display.

5. The display unit as claimed in claim 4, wherein the pressing section is bent in a direction away from the lateral side of the display at the first contacting position.

6. The display unit as claimed in claim 4, wherein the lower cover has a post protruding upwardly, and the pressing section comprises a second contacting position in contact with an outer surface of the post.

7. The display unit as claimed in claim 6, wherein the pressing section is bent in a direction towards the lateral side of the display at the second contacting position.

8. The display unit as claimed in claim 6, wherein the bracket comprises a flange extending downwardly and horizontally from a side of the plate, an opening being defined at a boundary of the flange and the plate, and the tab being located within the opening.

9. The display unit as claimed in claim 8, wherein the lower cover comprises a hook extending upwardly, the bracket has a depression formed in the flange, and the hook being engaged in the depression.

10. The display unit as claimed in claim 9, wherein the hook is located adjacent to the post.

11. A display unit comprising:
a lower cover;
a display disposed on the lower cover;
an electrically-conductive bracket securing the display on the lower cover, the bracket being grounded; and
an upper cover fixed to the lower cover and covering the display and the bracket;
wherein the bracket has a portion in contact with a surface of the display to dissipate static electricity generated on the surface of the display to ground; and
wherein the bracket has a plate in contact with a back surface of the display and a tab in contact with a lateral surface of the display, and the portion of the bracket being the tab.

12. The display unit as claimed in claim 11, wherein the tab is deformable and is pushed to contact the lateral surface of the display by a post of the lower cover.

13. The display unit as claimed in claim 12, wherein the tab has a first contacting position in contact with the lateral surface of the display and a second contacting position in contact with an outer circumferential surface of the post, and the tab being bent twice at the first contacting position and the second contacting position, respectively.

14. The display unit as claimed in claim 13, wherein the lower cover has a hook located adjacent to the post, and the bracket has a depression locked with the hook.

15. The display unit as claimed in claim 11, wherein the bracket is a punched metal sheet.

\* \* \* \* \*